(12) United States Patent
Chung

(10) Patent No.: US 8,508,272 B2
(45) Date of Patent: Aug. 13, 2013

(54) DATA OUTPUT CIRCUIT AND DATA OUTPUT METHOD THEREOF

(75) Inventor: Jin-Il Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 234 days.

(21) Appl. No.: 12/778,770

(22) Filed: May 12, 2010

(65) Prior Publication Data

US 2011/0210773 A1   Sep. 1, 2011

(30) Foreign Application Priority Data

Feb. 26, 2010   (KR) ........................ 10-2010-0017980

(51) Int. Cl.
*H03L 7/00*   (2006.01)
(52) U.S. Cl.
USPC .......................................................... 327/161
(58) Field of Classification Search
USPC ................................................. 327/158, 161
See application file for complete search history.

(56) References Cited

U.S. PATENT DOCUMENTS 7,532,050 B2 *   5/2009   Haerle et al. .................. 327/158

FOREIGN PATENT DOCUMENTS

| KR | 1020070109683 | 11/2007 |
|----|---------------|---------|
| KR | 1020080069756 | 7/2008  |

OTHER PUBLICATIONS

Notice of Preliminary Rejection issued from Korean Intellectual Property Office on Jun. 28, 2011.
Notice of Allowance issued from Korean Intellectual Property Office on Aug. 31, 2011.

* cited by examiner

*Primary Examiner* — Daniel Rojas
(74) *Attorney, Agent, or Firm* — IP & T Group LLP

(57) ABSTRACT

A data output circuit and a data output method thereof are provided. The data output circuit includes a delay locked loop, a duty ratio correction block, and an output unit. The delay locked loop corrects a duty ratio of a first internal clock. The delay locked loop includes a correction enable signal output unit configured to output a correction enable signal when the operation of correcting the duty ratio of the first internal clock is completed. The duty ratio correction block corrects the duty ratio of the first internal clock by using a duty ratio detection signal in response to the correction enable signal, and outputs the corrected first internal clock as an output clock. The output unit detects a duty ratio of the output clock, generates the duty ratio detection signal to the duty ratio correction block, and outputs a data strobe signal in response to the output clock.

17 Claims, 7 Drawing Sheets

DATA OUTPUT CIRCUIT AND DATA OUTPUT METHOD THEREOF

CROSS-REFERENCE TO RELATED APPLICATIONS

The present application claims priority of Korean Patent Application No. 10-2010-0017980, filed on Feb. 26, 2010, which is incorporated herein by reference in its entirety.

BACKGROUND OF THE INVENTION

Exemplary embodiments of the present invention relate to a data output circuit of a semiconductor memory device, and more particularly, to a data output circuit for correcting a duty ratio of an output clock, and a data output method thereof.

Synchronous semiconductor memory devices are designed to operate in synchronization with an external clock. Double data rate (DDR) synchronous memory devices successively process two-bit data in one clock cycle in synchronization with the rising and falling edges of an external clock. The DDR synchronous memory devices may use a delay locked loop (DLL) to implement accurate data input/output timings.

In such synchronous semiconductor memory devices, data are inputted and outputted based on a clock and it is desirable to exactly control a duty ratio of a clock. If a duty ratio of a clock is not accurately controlled, data margin may not be ensured, causing distortion of data.

A duty ratio refers to a ratio of a high level duration to a low level duration in one clock cycle. For example, the duty ratio of (50:50) means that a high level duration is equal to a low level duration in one clock cycle.

FIG. 1 is a configuration diagram of a conventional data output circuit.

Referring to FIG. 1, the conventional data output circuit includes a DLL 110, a repeater 130, an output control unit 170, and an output unit 190.

The DLL 110 compares a phase of an external clock CLK with a phase of an internal clock, synchronizes the phase of the internal clock with the phase of the external clock CLK, corrects a duty ratio of the internal clock to, for example, 50:50, and outputs first internal clocks RCLK_DLL1 and FCLK_DLL1.

The repeater 130 removes distortion of the first internal clocks RCLK_DLL1 and FCLK_DLL1 outputted from the DLL 110, and outputs output clocks RCLK_DO and FCLK_DO.

The output unit 190 includes a data output section 193 and a data strobe signal output section 191, and outputs data DQ and data strobe signals DQS and DQSB in response to the output clocks RCLK_DO and FCLK_DO. The data strobe signal output section 191 generates the data strobe signals DQS and DQSB by using the output clocks RCLK_DO and FCLK_DO, and outputs the generated signals to, for example, a memory controller (not shown). The data output section 193 outputs the data DQ to the memory controller (not shown) in response to the output clocks RCLK_DO and FCLK_DO and the data strobe signals DQS and DQSB.

Since the data output section 193 and the data strobe signal output section 191 output the data DQ and the data strobe signals DQS and DQSB in response to the output clocks RCLK_DO and FCLK_DO, respectively, the phase of the data DQ and the phase of the data strobe signals DQS and DQSB are synchronized with each other. The memory controller receives the data DQ outputted from the data output section 193, based on the data strobe signals DQS and DQSB outputted from the data strobe signal output section 191.

The output control unit 170 controls the output unit 190 and the repeater 130 using a clock enable signal CKEN representing an operation of the semiconductor memory device, such as a read operation.

FIG. 2 is a configuration diagram of the DLL 110 illustrated in FIG. 1.

Referring to FIG. 2, the DLL 110 includes a phase comparison unit 201, a delay control unit 203, a replica model unit 205, and a duty ratio correction unit 207.

The phase comparison unit 201 compares a phase of an external clock CLK with a phase of a feedback clock FB_CLK outputted from the replica model unit 205, which models a clock delay in the inside of the semiconductor memory device, and outputs a comparison signal CMP to the delay control unit 203. The comparison signal CMP represents a phase difference between the external clock CLK and the feedback clock FB_CLK.

The delay control unit 203 delays the external clock CLK by a first delay amount DD_1 (shown in FIG. 3) in response to the comparison signal CMP in order to synchronize the phase of the external clock CLK with the phase of the feedback clock FB_CLK, and outputs a delayed clock CLK_DD. The duty ratio correction unit 207 corrects a duty ratio of the delayed clock CLK_DD, and outputs a corrected clock, a first rising internal clock RCLK_DLL1, to the replica model unit 205.

Through the above-described procedures, the delay of the delay control unit 203 and the delay of the replica model unit 205 are mirrored or manifested in the feedback clock FB_CLK outputted from the replica model unit 205, so that the phase of the feedback clock FB_CLK is synchronized with the phase of the external clock CLK. At this time, the delayed clock CLK_DD in which the delay of the delay control unit 203 is mirrored is delay-locked.

The duty ratio correction unit 207 includes a correction section 209 and a detection section 211.

The detection section 211 detects duty ratios of the first internal clocks RCLK_DLL1 and FCLK_DLL1 outputted from the correction section 209, and generates detection signals DCC and DCCB representing the duty ratios of the first internal clocks RCLK_DLL1 and FCLK_DLL1.

The correction section 209 corrects the duty ratio of the delayed clock CLK_DD, which is outputted from the delay control unit 203, in response to the detection signals DCC and DCCB, and outputs first internal clocks RCLK_DLL1 and FCLK_DLL1 whose phases are opposite to each other and whose duty ratios are corrected to, for example, 50:50.

However, when the distortion of the duty ratios of the first internal clocks RCLK_DLL1 and FCLK_DLL1 is out of the allowable duty ratio correction range of the duty ratio correction unit 207, the conventional DLL 110 outputs the first internal clocks RCLK_DLL and FCLK_DLL whose duty ratios are not accurately corrected to 50:50. Since the conventional data output circuit uses the first internal clocks RCLK_DLL1 and FCLK_DLL1, whose duty ratios are not accurately corrected, as the output clocks RCLK_DO and FCLK_DO for data output, the data output unit 190 outputs data based on the data strobe signals DQS and DQSB whose duty ratios are distorted. Consequently, data margin may be reduced and thus output data of the semiconductor memory device may be distorted.

Furthermore, even though the correction section 209 of the DLL 110 accurately corrects the duty ratios of the first internal clocks RCLK_DLL1 and FCLK_DLL1, the duty ratios of the first internal clocks RCLK_DLL1 and FCLK_DLL1 may be distorted by external noises, distortion of transmission lines, or PVT variations, while passing through various internal circuits. Consequently, data margin may be reduced and thus output data of the semiconductor memory device may be distorted.

FIG. 3 is a timing diagram explaining a data output operation of the data output circuit shown in FIG. 1.

The DLL 110 delays the external clock CLK by the first delay amount DD_1 and generates the first internal clocks RCLK_DLL1 and FCLK_DLL1. For example, although the duty ratio of the external clock CLK is not 50:50, the duty ratios of the first internal clocks RCLK_DLL1 and FCLK_DLL1 are corrected to 50:50 by the duty ratio correction unit 207.

However, while the first internal clocks RCLK_DLL1 and FCLK_DLL1 pass through several internal circuits including the repeater 130, their duty ratios may be distorted by external noises, distortion of transmission lines, or PVT variations. Upon receipt of the distorted internal clocks RCLK_DLL1 and FCLK_DLL1, the data output circuit uses the first internal clocks RCLK_DLL1 and FCLK_DLL1, whose duty ratios are distorted, as the output clocks RCLK_DO and FCLK_DO. The output unit 190 outputs data DQ in synchronization with the rising edges of the output clocks RCLK_DO and FCLK_DO whose duty ratios are distorted. Consequently, data margin is reduced and jitter characteristic is degraded, resulting in distortion of the output data DQ.

Since the conventional data output circuit outputs data based on the data strobe signals whose duty ratios are distorted, data margin may be reduced and output data of the semiconductor memory device may be distorted.

SUMMARY OF THE INVENTION

An embodiment of the present invention is directed to a data output circuit capable of improving jitter characteristic and ensuring data margin and a data output method thereof.

The data output circuit corrects duty ratios of output clocks (RCLK_DO, FCLK_DO), which are used to output data strobe signals (DQS, DQSB), thereby improving jitter characteristics of output data and data strobe signals and ensuring data margin.

A data output circuit in accordance with an embodiment of the present invention is also capable of outputting data based on data strobe signals whose duty ratios are accurately corrected, even though duty ratios of internal clocks outputted from a DLL therein are distorted.

In accordance with an embodiment of the present invention, a data output circuit include: a delay locked loop configured to correct a duty ratio of a first internal clock and output a correction enable signal when the operation of correcting the duty ratio of the first internal clock is completed; a duty ratio correction block configured to correct the duty ratio of the first internal clock by using a duty ratio detection signal in response to the correction enable signal, and output the corrected first internal clock as an output clock; and an output unit configured to generate the duty ratio detection signal by detecting a duty ratio of the output clock, and output a data strobe signal in response to the output clock.

In accordance with another embodiment of the present invention, a data output method includes: outputting an internal clock as an output clock and simultaneously outputting a correction enable signal, when a duty ratio correction operation of the internal clock is completed; detecting a duty ratio of the output clock to generate a duty ratio detection signal in response to a clock enable signal; generating a duty ratio correction code based on the duty ratio detection signal in response to the correction enable signal; and correcting a duty ratio of the output clock in response to the duty ratio correction code.

In accordance with further embodiment of the present invention, a data output circuit includes: a delay locked loop configured to generate an internal clock; a duty ratio correction block configured to generate an output clock by correcting the duty ratio of the internal clock according to a duty ratio detection signal; and an output unit configured to output data in response to the output clock, wherein the output unit generates the duty ratio detection signal by detecting a duty ratio of the output clock.

DESCRIPTION OF SPECIFIC EMBODIMENTS

Figure 1:
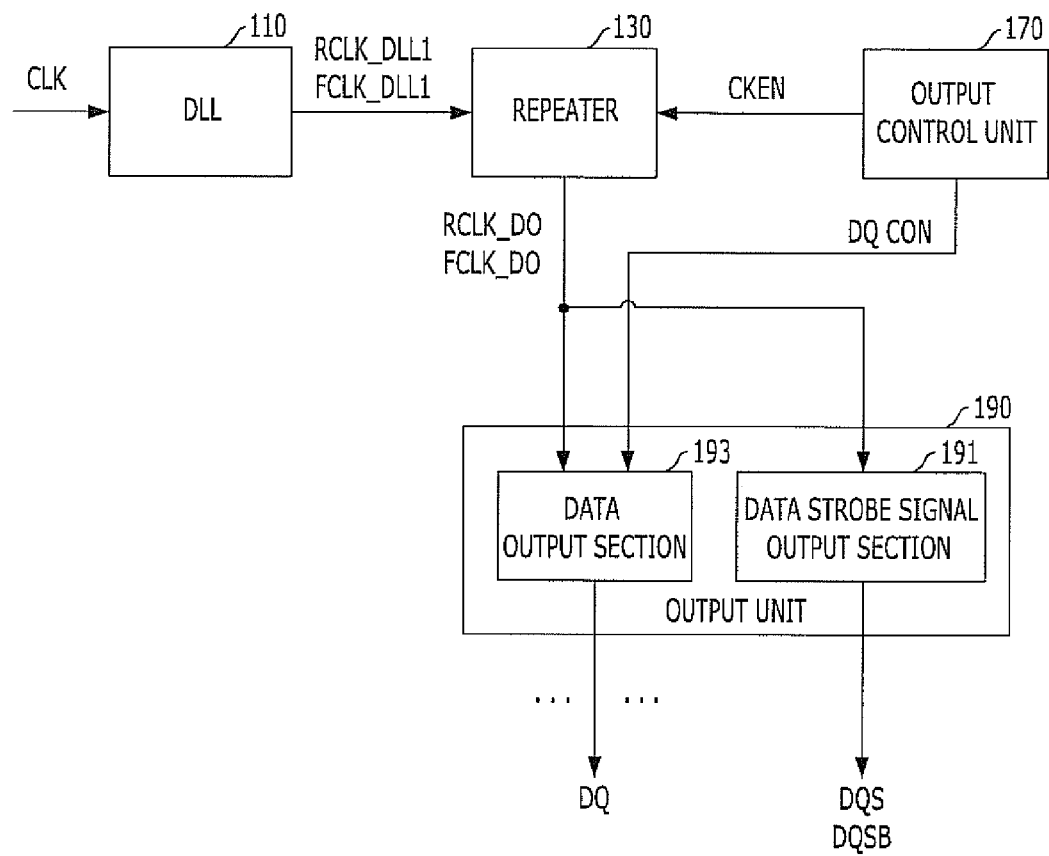
FIG. 1 is a configuration diagram of a conventional data output circuit.
Figure 2:
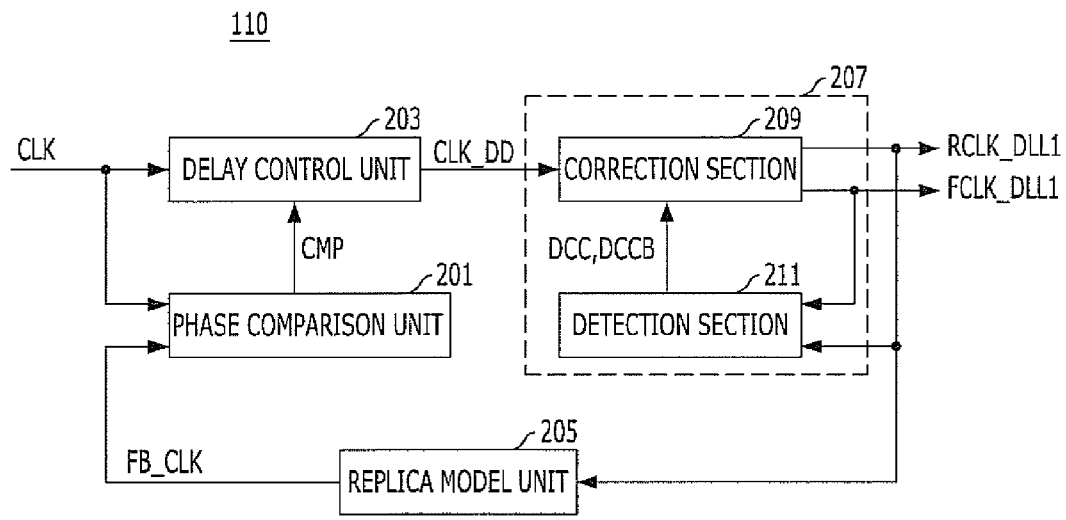
FIG. 2 is a configuration diagram of a DLL included in the conventional data output circuit of FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
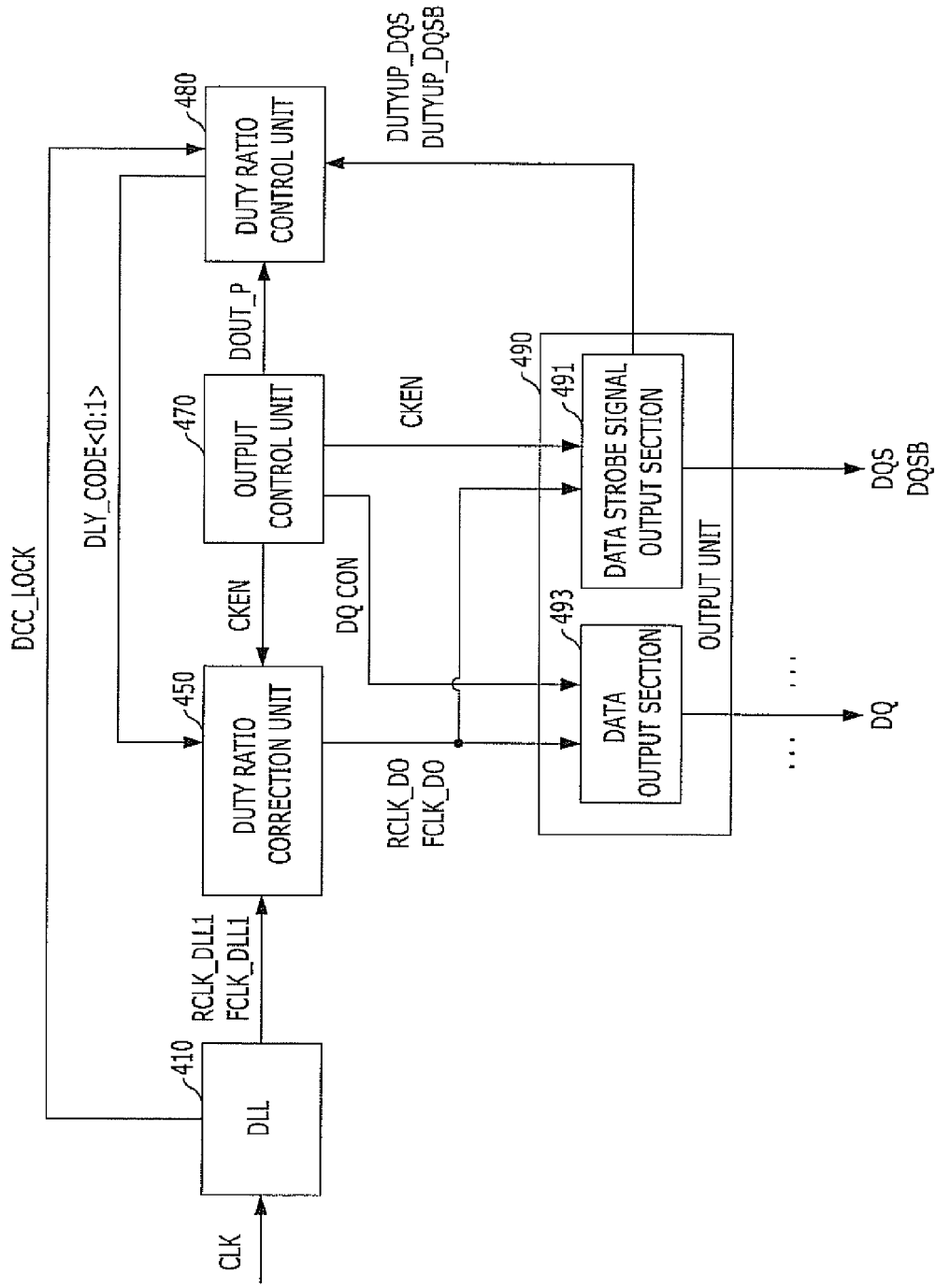
FIG. 4 is a configuration diagram of a data output circuit in accordance with an embodiment of the present invention.

FIG. 4 is a configuration diagram of a data output circuit in accordance with an embodiment of the present invention.

Referring to FIG. 4, a data output circuit in accordance with an embodiment of the present invention includes a DLL 410, a duty ratio correction unit 450, an output control unit 470, a duty ratio control unit 480, and an output unit 490.

The DLL 410 compares a phase of an external clock CLK with a phase of an internal clock, synchronizes the phase of the internal clock with the phase of the external clock CLK, corrects the duty ratio of the internal clock to, for example, 50:50, and outputs first internal clocks RCLK_DLL1 and FCLK_DLL1.

In addition, the DLL 410 outputs a correction enable signal DCC_LOCK to the duty ratio control unit 480.

The correction enable signal DCC_LOCK is a signal representing that the duty ratio correction operation of the DLL 410 is completed. A case in which the correction enable signal DCC_LOCK is activated (that is, the duty ratio correction operation of the DLL 410 is completed) will now be described in detail. The correction enable signal DCC_LOCK is activated when the duty ratio distortion degree of the internal clock is out of the duty ratio correction range of the DLL 410 and thus the duty ratio correction operation of the DLL 410 is stopped. In this case, the DLL 410 outputs the internal clocks, whose duty ratios are not corrected, as the first internal clocks RCLK_DLL1 and FCLK_DLL1. The correction enable signal DCC_LOCK is also activated when the DLL 410 completes the operation of correcting the duty ratios of the internal clocks to, for example, 50:50. In this case, the DLL 410 outputs the internal clocks, whose duty ratios are corrected, as the first internal clocks RCLK_DLL1 and FCLK_DLL1.

The duty ratio correction unit 450 corrects the duty ratios of the first internal clocks RCLK_DLL1 and FCLK_DLL1 to, for example, 50:50, in response to a duty ratio correction code DLY_CODE<0:1> outputted from the duty ratio control unit 480, and outputs the output clocks RCLK_DO and FCLK_DO.

Although not illustrated, the data output circuit may further include a repeater which removes signal distortion of the first internal clocks RCLK_DLL1 and FCLK_DLL1 outputted from the DLL 410.

The output unit 490 includes a data output section 493 and a data strobe signal output section 491. The output unit 490 generates data strobe signals DQS and DQSB by using the output clocks RCLK_DO and FCLK_DO, and outputs data DQ in response to the data strobe signals DQS and DQSB.

Specifically, the data strobe signal output section 491 generates the data strobe signals DQS and DQSB by using the output clocks RCLK_DO and FCLK_DO, and outputs the generated data strobe signals DQS and DQSB to a memory controller (not shown). The data strobe signal output section 491 receives a clock enable signal CKEN from the output control unit 470 in order to output data according to the operation mode of the semiconductor memory device.

The data strobe signal output section 491 detects the duty ratios of the output clocks RCLK_DO and FCLK_DO and generates duty ratio detection signals DUTYUP_DQS and DUTYUP_DQSB to the duty ratio control unit 480.

The duty ratio detection signals DUTYUP_DQS and DUTYUP_DQSB are signals representing the duty ratio correction direction of the output clocks RCLK_DO and FCLK_DO.

As such, since the data strobe signal output section 491 detects the duty ratios of the output clocks RCLK_DO and FCLK_DO immediately before it outputs the data strobe signals DQS and DQSB, the data strobe signals DQS and DQSB can be outputted based on the output clocks RCLK_DO and FCLK_DO whose duty ratios are corrected.

The data output section 493 outputs data DQ to the memory controller (not shown) in response to the output clocks RCLK_DO and FCLK_DO and the data strobe signals DQS and DQSB.

Since the data output section 493 and the data strobe signal output section 491 output the data DQ and the data strobe signals DQS and DQSB in response to the output clocks RCLK_DO and FCLK_DO, respectively, the phases of the data DQ and the data strobe signals DQS and DQSB are synchronized with each other. The memory controller receives the data DQ outputted from the data output section 493, based on the data strobe signals DQS and DQSB outputted from the data strobe signal output section 491.

The duty ratio control unit 480 is enabled in response to the activated correction enable signal DCC_LOCK. The duty ratio control unit 480 generates the duty ratio correction code DLY_CODE<0:1> for correcting the duty ratios of the output clocks RCLK_DO and FCLK_DO, by using the duty ratio detection signals DUTYUP_DQS and DUTYUP_DQSB received from the data strobe signal output section 491, and outputs the generated duty ratio correction code DLY_CODE<0:1> to the duty ratio correction unit 450.

The duty ratio correction unit 450 receiving the duty ratio correction code DLY_CODE<0:1> determines whether to increase the width of the high level duration or the low level duration of the output clocks RCLK_DO and FCLK_DO in response to the duty ratio correction code DLY_CODE<0:1>, and corrects their duty ratios to, for example, 50:50.

The output control unit 470 controls the output unit 490 and the duty ration correction unit 450 using the clock enable signal CKEN according to an operation (for example, a read operation) of the semiconductor memory device.

In summary, the data output circuit in accordance with the embodiment of the present invention corrects the duty ratio distortion of the output clocks RCLK_DO and FCLK_DO prior to the output of the data strobe signals DQS and DQSB, thereby ensuring data margin and improving jitter characteristic.

Figure 5:
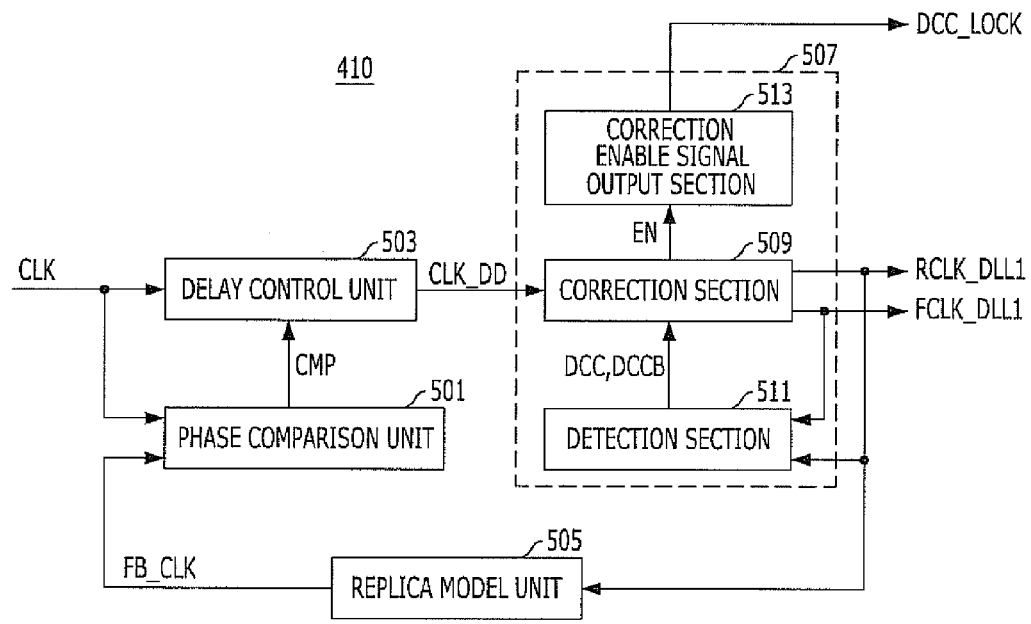
FIG. 5 is a configuration diagram of a DLL included in the data output circuit of FIG. 4.

FIG. 5 is a configuration diagram of the DLL 410 in FIG. 4.

The DLL 410 includes a phase comparison unit 501, a delay control unit 503, a replica model unit 505, and a duty ratio correction unit 507.

The phase comparison unit 501 compares a phase of an external clock CLK with a phase of a feedback clock FB_CLK outputted from the replica model unit 505, which models a clock delay component in the inside of the semiconductor memory device. The phase comparison unit 501 outputs a comparison signal CMP to the delay control unit 503. The comparison signal CMP represents a phase difference between the external clock CLK and the feedback clock FB_CLK.

The delay control unit 503 delays the external clock CLK by a first delay amount DD_1 (shown in FIG. 9) in response to the comparison signal CMP in order to synchronize the phase of the external clock CLK with the phase of the feedback clock FB_CLK, and outputs a delayed clock CLK_DD. The duty ratio correction unit 507 corrects the duty ratio of the delayed clock CLK_DD, and outputs a corrected clock, a first rising internal clock RCLK_DLL1, to the replica model unit 505.

Through the above-described procedures, the delay of the delay control unit 503 and the delay of the replica model unit 505 are mirrored or manifested in the feedback clock FB_CLK outputted from the replica model unit 505, so that the phase of the feedback clock FB_CLK is synchronized with the phase of the external clock CLK. At this time, the delayed clock CLK_DD in which the delay of the delay control unit 503 is mirrored is delay-locked.

The duty ratio correction unit 507 includes a correction section 509, a detection section 511, and a correction enable signal output section 513.

The detection section 511 detects the duty ratios of the first internal clocks RCLK_DLL1 and FCLK_DLL1 outputted from the correction section 509, and generates detection signals DCC and DCCB representing the duty ratios of the first internal clocks RCLK_DLL1 and FCLK_DLL1.

The correction section 509 corrects the duty ratio of the delayed clock CLK_DLL, which is outputted from the delay control unit 503, in response to the detection signals DCC and DCCB, and outputs first internal clocks RCLK_DLL1 and FCLK_DLL1 whose phases are opposite to each other and whose duty ratios are corrected.

The correction enable signal output section 513 outputs the correction enable signal DCC_LOCK. The correction enable signal DCC_LOCK is a signal representing that the duty ratio correction operation of the DLL 410 is completed. A case in which the correction enable signal DCC_LOCK is activated (that is, the duty ratio correction operation of the DLL 410 is completed) will now be described in detail. The correction enable signal DCC_LOCK is activated when the duty ratio distortion degree of the internal clocks is out of the duty ratio correction range of the DLL 410 and thus the duty ratio correction operation of the DLL 410 is stopped. In this case, the DLL 410 outputs the internal clocks, whose duty ratios are not corrected, as the first internal clocks RCLK_DLL1 and FCLK_DLL1. The correction enable signal DCC_LOCK is also activated when the DLL 410 completes the operation of correcting the duty ratios of the internal clocks to, for example, 50:50. In this case, the DLL 410 outputs the internal clocks, whose duty ratios are corrected, as the first internal clocks RCLK_DLL1 and FCLK_DLL1.

Figure 6:
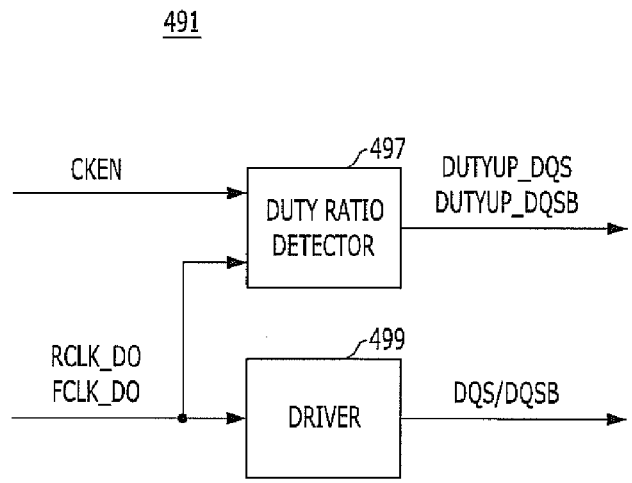
FIG. 6 is a configuration diagram of a data strobe signal output section included in an output unit of FIG. 4.

FIG. 6 is a configuration diagram of the data strobe signal output section 491 included in the output unit 490 of FIG. 4.

Referring to FIG. 6, the data strobe signal output section 491 includes a duty ratio detector 497 and a driver 499.

The duty ratio detector 497 is enabled by the clock enable signal CKEN, detects the duty ratios of the output clocks RCLK_DO and FCLK_DO, and generates the duty ratio detection signals DUTYUP_DQS and DUTYUP_DQSB representing the detection results.

When the duty ratios of the output clocks RCLK_DO and FCLK_DO are 50:50, the duty ratio detector 497 outputs the duty ratio detection signals DUTYUP_DQS and DUTYUP_DQSB of "0, 1" or "1, 0". Otherwise, it outputs the duty ratio detection signals DUTYUP_DQS and DUTYUP of "0, 0" or "1, 1" according to the duty ratios of the output clocks RCLK_DO and FCLK_DO. In accordance with an embodiment of the present invention, when the high level duration of the output clock FCLK_DO is greater than the low level duration thereof, the duty ratio detection signals DUTYUP_DQS and DUTYUP_DQSB of "1, 1" are outputted. On the other hand, when the high level duration of the output clock FCLK_DO is smaller than the low level duration thereof, the duty ratio detection signals DUTYUP_DQS and DUTYUP_DQSB of "0, 0" are outputted.

The driver 499 drives the output clocks RCLK_DO and FCLK_DO and outputs the data strobe signals DQS and DQSB.

As such, since the data output circuit in accordance with the embodiment of the present invention detects the duty ratios of the output clocks RCLK_DO and FCLK_DO immediately before they are used to output the data DQ and the data strobe signals DQS and DQSB from the output unit 490 to the outside, the margins of the data strobe signals DQS and DQSB and the data DQ may be ensured and their jitter characteristics may be improved.

Figure 7:
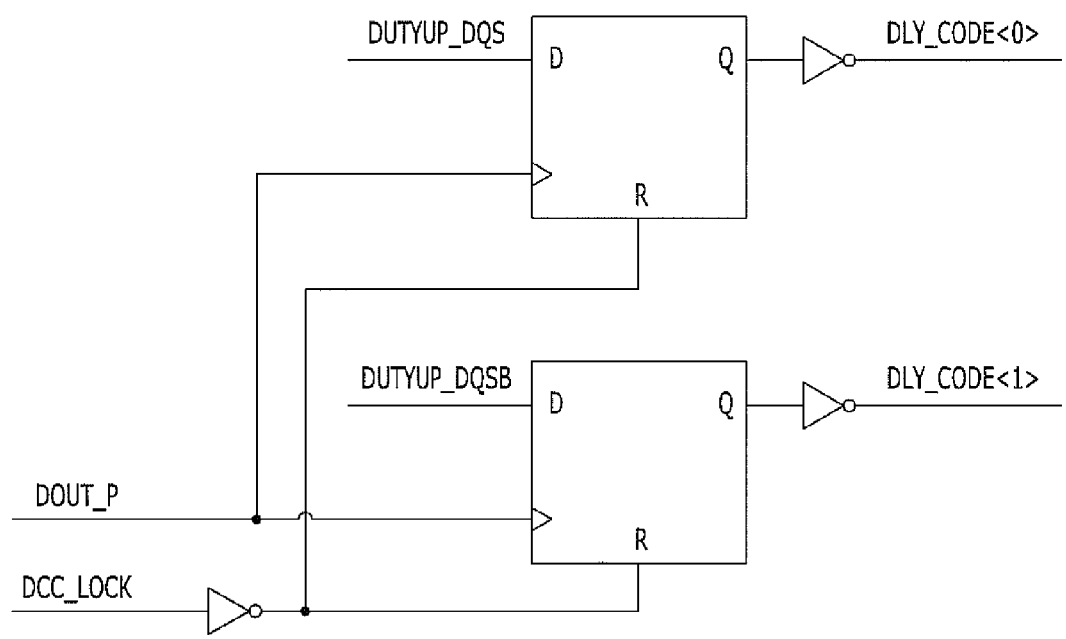
FIG. 7 is a configuration diagram of a duty ratio control unit included in the data output circuit of FIG. 4.

FIG. 7 is a configuration diagram of the duty ratio control unit 480 in FIG. 4.

Referring to FIG. 7, the duty ratio control unit 480 receives the duty ratio detection signals DUTYUP_DQS and DUTYUP_DQSB, a latch enable signal DOUT_P, and the correction enable signal DCC_LOCK, and generates the duty ratio correction code DLY_CODE<0:1> according to the correction enable signal DCC_LOCK and the duty ratio detection signals DUTYUP_DQS and DUTYUP_DQSB.

To this end, as illustrated in FIG. 7, the duty ratio control unit 480 may be implemented with a D flip-flop. The operation of the duty ratio control unit 480 will be described below with reference to Table 1 below.

TABLE 1

| Correction enable signal | Duty ratio detection signal | | Duty ratio correction code |
|---|---|---|---|
| DCC_LOCK | DUTYUP_DQS | DUTYUP_DQSB | DLY_CODE<0:1> |
| 0 | — | — | <1:0>: DLY_CODE_INT |
| 1 | 0 | 0 | <1:1> |
| 1 | 0 | 1 | <0:1> |
| 1 | 1 | 0 | <1:0> |
| 1 | 1 | 1 | <0:0> |

When the correction enable signal DCC_LOCK is activated, the duty ratio control unit 480 generates the duty ratio correction code DLY_CODE<0:1> according to the duty ratio detection signals DUTYUP_DQS and DUTYUP_DQSB. When the correction enable signal DCC_LOCK is deactivated, the duty ratio control unit 480 generates an initialization code DLY_CODE_INT of the duty ratio correction code DLY_CODE<0:1>.

The duty ratio control unit 480 outputs the duty ratio correction code DLY_CODE<0:1> of "<0:1>" or "<1:0>" in response to the duty ratio detection signals DUTYUP_DQS and DUTYUP_DQSB of "0, 1" or "1, 0" received from the duty ratio detection section 497. The duty ratio correction code DLY_CODE<0:1> of "<0:1>" or "<1:0>" represents that the duty ratio correction unit 450 need not correct the duty ratios any more because the duty ratios of the output clocks RCLK_DO and FCLK_DO have already been corrected to, for example, 50:50.

The duty ratio control unit 480 outputs the duty ratio correction code DLY_CODE<0:1> of "<0:0>" in response to the duty ratio detection signals DUTYUP_DQS and DUTYUP_DQSB of "1, 1" received from the duty ratio detection section 497. The duty ratio correction code DLY_CODE<0:1> of "<0:0>" represents that the duty ratio correction unit 450 is to correct the duty ratios to, for example, 50:50 by reducing the high level duration of the output clock FCLK_DO because the high level duration of the output clock FCLK_DO is greater than the low level duration thereof.

The duty ratio control unit 480 outputs the duty ratio correction code DLY_CODE<0:1> of "<1:1>" in response to the duty ratio detection signals DUTYUP_DQS and DUTYUP_DQSB of "0, 0" received from the duty ratio detection section 497. The duty ratio correction code DLY_CODE<0:1> of "<1:1>" represents that the duty ratio correction unit 450 is to correct the duty ratios to, for example, 50:50 by increasing the high level duration of the output clock FCLK_DO because the high level duration of the output clock FCLK_DO is smaller than the low level duration thereof.

Figure 8:
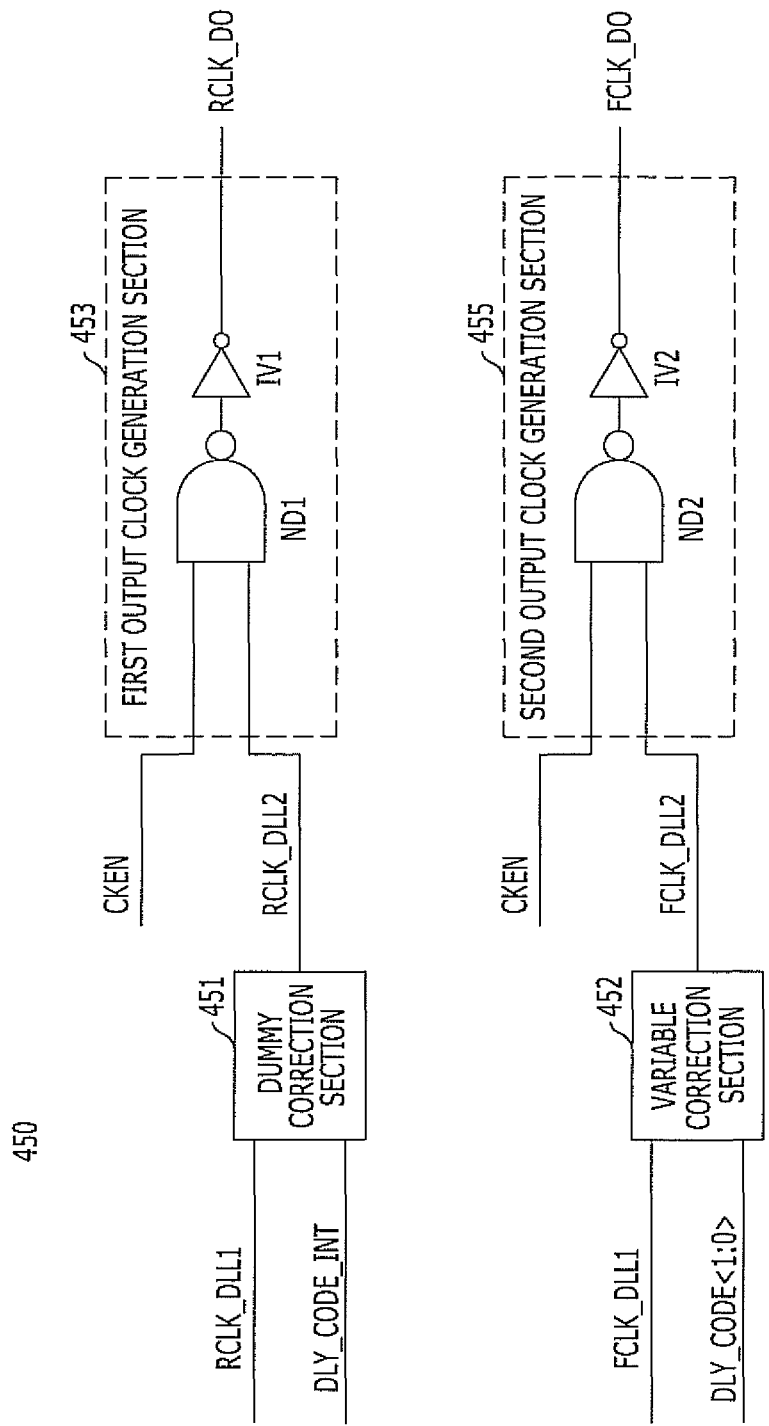
FIG. 8 is a configuration diagram of a duty ratio correction unit included in the data output circuit of FIG. 4.

FIG. 8 is a configuration diagram of the duty ratio correction unit 450 in FIG. 4.

Referring to FIG. 8, the duty ratio correction unit 450 corrects the duty ratios of the first internal clocks RCLK_DLL1 and FCLK_DLL1 and outputs the corrected clocks as the output clocks RCLK_D0 and FCLK_DO in response to the duty ratio correction code DLY_CODE<0:1> received from the duty ratio control unit 480.

To this end, the duty ratio correction unit 450 includes a dummy correction section 451, a first output clock generation section 453, a variable correction section 452, and a second output clock generation section 455.

The dummy correction section 451 receives a first rising internal clock RCLK_DLL1 and the initialization code DLY_CODE_INT "<1:0>" of the duty ratio correction code DLY_CODE<0:1>, and does not perform the operation of correcting the duty ratio of the first rising internal clock RCLK_DLL1. However, the dummy correction section 451 performs a delay operation to synchronize the phase of the first rising internal clack RCLK_DLL1 with the phase of a second falling internal clock FCLK_DLL2, and outputs a second rising internal clock RCLK_DLL2.

The variable correction section 452 receives a first falling internal clock FCLK_DLL1 and the duty ratio correction code DLY_CODE<0:1> of "<1:1>, <0:1>, <1:0> and <0:0>", corrects the duty ratio of the first falling internal clock FCLK_DLL1, and outputs the second falling internal clock FCLK_DLL2.

In this embodiment, the duty ratio of the first falling internal clock FCLK_DLL1 is corrected, while synchronizing the first rising internal clock RCLK_DLL1 with the first internal clock FCLK_DLL1, in order to prevent the phase locked by the DLL 410 from being distorted while correcting the duty ratios of the two signals. The duty ratio of the rising internal clock RCLK_DLL1 can be corrected according to the exemplary embodiments of the present invention.

Figure 9:
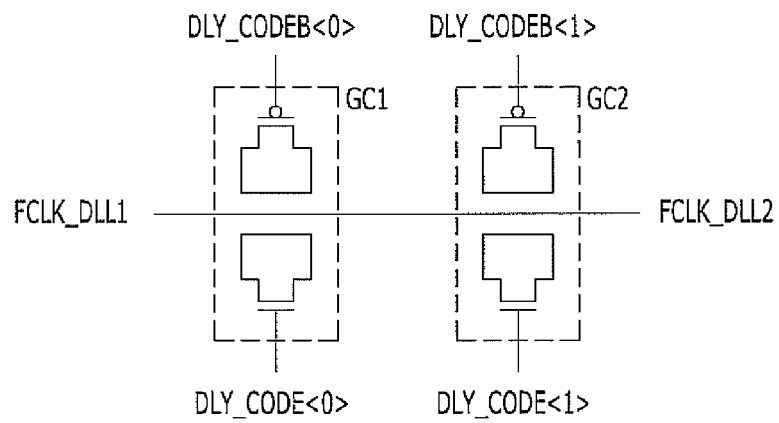
FIG. 9 is a configuration diagram of a variable correction section included in the duty ratio correction unit of FIG. 8.

To this end, as illustrated in FIG. 9, the dummy correction section 451 and the variable correction section 452 include a first gate capacitor GC1 and a second gate capacitor GC2. FIG. 9 is a configuration diagram of the variable correction section 452 receiving the duty ratio correction code DLY_CODE<0:1>. The dummy correction section 451 operates in the same way as the variable correction section 452 except that it receives only the initialization code DLY_CODE_INT "<1:0>".

The operation of the duty ratio correction unit 450 according to the duty ratio correction code DLY_CODE<0:1> will now be described with reference to Table 2 below and FIG. 9.

TABLE 2

| Duty ratio correction code DLY_CODE<0:1> | First gate capacitor GC1 | Second gate capacitor GC2 | Operation of duty ratio correction unit 450 |
|---|---|---|---|
| <1:1> | Turn on | Turn on | Operation of increasing duty ratio |
| <0:1> | Turn off | Turn on | No duty ratio correction |
| <1:0> | Turn on | Turn off | No duty ratio correction |
| <0:0> | Turn off | Turn off | Operation of decreasing duty ratio |

The duty ratio correction code DLY_CODE<0:1> of "<0:1>" or "<1:0>" represents that the duty ratio correction unit 450 need not correct the duty ratio because the duty ratios of the output clocks RCLK_DO and FCLK_DO have already been corrected to, for example, 50:50. That is, when the duty ratio correction code DLY_CODE<0:1> of "<0:1>" or "<1:0>" is inputted to the gates of the first and second gate capacitors GC1 and GC2, only one of the first and second gate capacitors GC1 and GC2 is selectively turned on. Consequently, one of the first and second gate capacitors GC1 and GC2 is charged, and the other is discharged. Thus, the output clocks RCLK_DO and FCLK_DO maintain the previous duty ratios.

The duty ratio correction code DLY_CODE<0:1> of "<0:0>" represents that the duty ratio correction unit 450 is to correct the duty ratios to, for example 50:50 by reducing the high level durations of the output clock FCLK_DO because the high level duration of the output clock and FCLK_DO are greater than the low level duration thereof. That is, when the duty ratio correction code DLY_CODE<0:1> of "<0:0>" is inputted to the gates of the first and second gate capacitors GC1 and GC2, both of the first and second gate capacitors GC1 and GC2 are turned off. Consequently, as the second internal clock FCLK_DLL2 is not charged but discharged, the high level duration is reduced so that the duty ratio is corrected to, for example, 50:50.

The duty ratio correction code DLY_CODE<0:1> of "<1:1>" represents that the duty ratio correction unit 450 is to correct the duty ratios to, for example 50:50 by increasing the high level duration of the output clock FCLK_DO because the high level duration of the output clock and FCLK_DO are smaller than the low level duration thereof. That is, when the duty ratio correction code DLY_CODE<0:1> of "<1:1>" is inputted to the gates of the first and second gate capacitors GC1 and GC2, both of the first and second gate capacitors GC1 and GC2 are turned on. Consequently, as the second internal clock FCLK_DLL2 is not discharged but charged, the high level duration is increased so that the duty ratio is corrected to, for example, 50:50.

The first and second output clock generation sections 453 and 455 output the second rising internal clock RCLK_DLL2 and the second falling internal clock FCLK_DLL2, which are outputted from the dummy correction section 451 and the variable correction section 452, as the output clocks RCLK_DO and FCLK_DO in response to the clock enable signal CKEN.

To this end, the first output clock generation section 453 may be implemented with a NAND gate ND1 and an inverter IV1, and the second output clock generation section 455 may be implemented with a NAND gate ND2 and an inverter IV2. The NAND gate ND1 performs a NAND operation on the clock enable signal CKEN received from the output control unit 470 and the second rising internal clock RCLK_DLL2 received from the dummy correction section 451, and the NAND gate ND2 performs a NAND operation on the clock enable signal CKEN received from the output control unit 470 and the second falling internal clock FCLK_DLL2 received from the variable correction section 452. The inverter IV1 inverts the output signal of the NAND gate ND1 and outputs the output clock RCLK_DO, and the inverter IV2 inverts the output signal of the NAND gate ND2 and outputs the output clock FCLK_DO.

Figure 10:
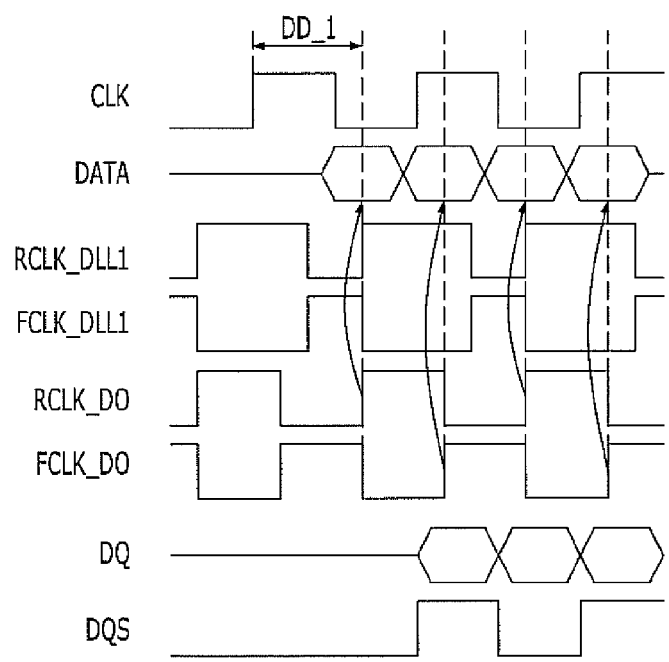
FIG. 10 is a timing diagram explaining a data output operation of the data output circuit shown in FIG. 4.

FIG. 10 is a timing diagram explaining a data output operation of the data output circuit shown in FIG. 4.

The DLL 410 delays the external clock CLK having the duty ratio of 50:50 by the first delay amount DD_1 and generates the first internal clocks RCLK_DLL1 and FCLK_DLL1.

At this time, the duty ratio correction range of the first internal clocks RCLK_DLL1 and FCLK_DLL1 may exceed the correction capability of the correction section 509 included in the DLL 410, and thus, the first internal clocks RCLK_DLL1 and FCLK_DLL1 may be outputted in such a state their duty ratios are not corrected. In addition, when the first internal clocks RCLK_DLL1 and FCLK_DLL1, whose duty ratios are corrected by the DLL 410, are transferred to the output unit 490, the duty ratios may be distorted by external noises or the like.

To this end, the data strobe signal output section 491 included in the output unit 490 detects the duty ratios of the output clocks RCLK_DO and FCLK_DO before the data strobe signals DQS and DQSB are outputted.

The duty ratio control unit 480 controls the duty ratio correction unit 450 to correct the duty ratios of the output clocks RCLK_DO and FCLK_DO, whose duty ratios are detected as being distorted immediately before the data strobe signals are outputted. Hence, the output clocks RCLK_DO and FCLK_DO whose duty ratios are corrected to, for example, 50:50, are outputted. Consequently, data margin may be ensured and jitter characteristic of the data output circuit may be improved.

Figure 3:
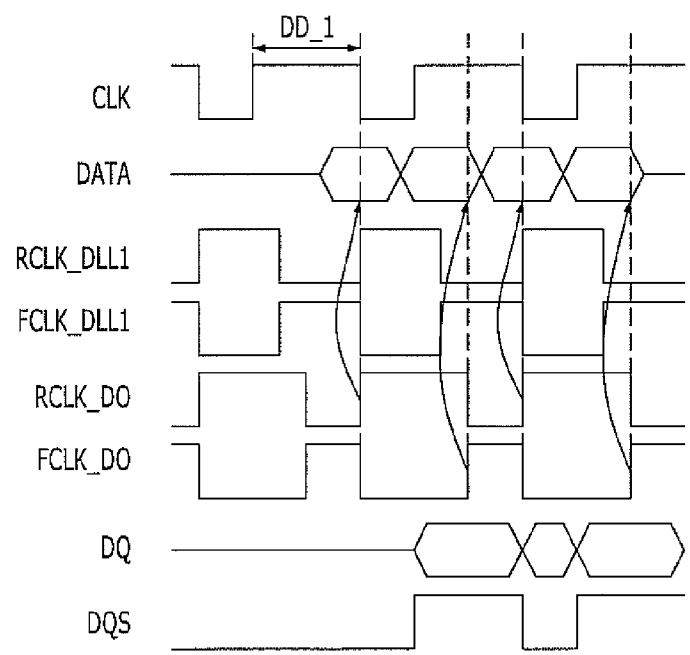
FIG. 3 is a timing diagram explaining a data output operation of the conventional data output circuit shown in FIG. 1.

Therefore, unlike in FIG. 3, the data output section 493 in accordance with the embodiment of the present invention latches the data DQ in such a state that data margin is ensured at the rising edges of the output clocks RCLK_DO and FCLK_DO whose duty ratios are corrected, thereby outputting the data strobe signals DQS and DQSB without distortion.

Meanwhile, the phases of the output data DQ and the data strobe signals DQS and DQSB are synchronized with the phase of the external clock EXT.

As described above, the data output circuit in accordance with the embodiment of the present invention detects the duty ratios of the data strobe signals DQS and DQSB and corrects the duty ratios of the output clocks RCLK_DO and FCLK_DO, which are the base of the data strobe signals DQS and DQSB. Thus, it is possible to improve the jitter characteristic of the data outputted from the data output circuit and ensure the data margin.

The data output circuit in accordance with the embodiment of the present invention can correct the duty ratio distortion of the first internal clocks RCLK_DLL1 and FCLK_DLL1, which may occur from the output of the first internal clocks RCLK_DLL1 and FCLK_DLL1, whose duty ratios are corrected by the DLL 410, to the input of the first internal clocks RCLK_DLL1 and FCLK_DLL1 to the output unit 490. Consequently, the data margin may be ensured and the jitter characteristic of the data output circuit may be improved.

Furthermore, even though the duty ratios of the first internal clocks RCLK_DLL1 and FCLK_DLL1 outputted from the DLL 410 are not synchronized with each other, the data may be outputted based on the data strobe signals whose duty ratios are synchronized with each other.

While the present invention has been described with respect to the specific embodiments, it will be apparent to those skilled in the art that various changes and modifications may be made without departing from the spirit and scope of the invention as defined in the following claims.

What is claimed is:

1. A data output circuit, comprising:
    a delay locked loop configured to output a first internal clock, which is delay-locked and duty ratio-corrected, and output a correction enable signal when the operation of correcting the duty ratio for the first internal clock is completed;
    a duty ratio correction block configured to correct the duty ratio of the delay locked loop output clock signal by using a duty ratio detection signal in response to the correction enable signal, and output the corrected first internal clock as an output clock; and
    an output unit configured to generate the duty ratio detection signal by detecting a duty ratio of the output clock, and output a data strobe signal in response to the output clock,
    wherein the duty ratio correction block comprises:
        a duty ratio control unit configured to be enabled by the correction enable signal and generate a duty ratio correction code corresponding to the duty ratio detection signal; and
        a duty ratio correction unit configured to output the output clock by correcting the duty ratio of the first internal clock in response to the duty ratio correction code.

2. The data output circuit of claim 1, wherein the correction enable signal is activated when a duty ratio distortion of the first internal clock is out of a correction range of the delay locked loop.

3. The data output circuit of claim 2, wherein the correction enable signal is activated when the duty ratio of the first internal clock is corrected by the delay locked loop.

4. The data output circuit of claim 1, wherein the delay locked loop comprises:
    a detection unit configured to detect the duty ratio of the first internal clock and output a detection signal;
    a correction unit configured to correct the duty ratio of the first internal clock in response to the detection signal, and output the first internal clock; and
    a correction enable signal output unit configured to output the correction enable signal when the correction operation of the correction unit is completed.

5. The data output circuit of claim 1, wherein the output unit is configured to output data in response to the output clock.

6. The data output circuit of claim 1, further comprising an output control unit configured to generate a clock enable signal to enable the duty ratio correction block and the output unit.

7. The data output circuit of claim 1, wherein the duty ratio correction unit comprises a delay unit configured to correct the duty ratio of the first internal clock in response to the duty ratio correction code, and output the corrected first internal clock as a second internal clock.

8. The data output circuit of claim 7, wherein the delay unit comprises:
    a variable correction section configured to correct a duty ratio of a first falling clock of the first internal clock in response to the duty ratio correction code, and output a second falling internal clock; and
    a dummy correction section configured to synchronize a first rising internal clock of the first internal clock with the second falling internal clock, and output a second rising internal clock.

9. The data output circuit of claim 8, wherein the dummy correction section and the variable correction section comprise at least two gate capacitors connected in series and configured to be turned on and off according to a logic level of the duty ratio correction code.

10. The data output circuit of claim 9, wherein the dummy correction section is configured to equalize the number of gate capacitors to be turned on among the gate capacitors to the number of gate capacitors to be turned off among the gate capacitors.

11. The data output circuit of claim 9, wherein the variable correction section is configured to increase the high level duration of the second falling internal clock by performing a charging operation according to the turn-on of the gate capacitor and decrease the high level duration of the second falling internal clock by performing a discharging operation according to the turn-off of the gate capacitor, in response to the duty ratio correction code.

12. The data output circuit of claim 8, wherein the duty ratio correction unit further comprises:
   a first output clock generation section configured to output the second rising internal clock as a rising output clock; and
   a second output clock generation section configured to output the second falling internal clock as a falling output clock.

13. The data output circuit of claim 1, wherein the duty ratio control unit comprises a D flip-flop configured to be enabled by the correction enable signal and generate the duty ratio correction code corresponding to the duty ratio detection signal.

14. A data output circuit, comprising:
   a delay locked loop configured to generate an internal clock, which is delay-locked and duty ratio-corrected;
   a duty ratio correction block configured to generate an output clock by correcting the duty ratio of the internal clock according to a duty ratio detection signal; and
   an output unit configured to output data in response to the output clock, wherein the output unit generates the duty ratio detection signal by detecting a duty ratio of the output clock,
   wherein the duty ratio correction block comprises:
      a duty ratio control unit configured to be enabled by a correction enable signal and generate a duty ratio correction code corresponding to the duty ratio detection signal; and
      a duty ratio correction unit configured to output the output clock by correcting the duty ratio of the internal clock in response to the duty ratio correction code.

15. The data output circuit of claim 14, wherein the delay locked loop outputs the correction enable signal to enable the duty ratio correction block when an operation of correcting the duty ratio of the internal clock by the delay locked loop is complete.

16. The data output circuit of claim 14, wherein the duty ratio correction block corrects a duty ratio of a first clock of the internal clock in response to the duty ration detection signal while synchronizing a second clock of the internal clock with the first clock.

17. The data output circuit of claim 14, wherein the output unit generates a data strobe signal in response to the output clock.

* * * * *